US007977197B2

(12) United States Patent

Knaipp et al.

(10) Patent No.: US 7,977,197 B2

(45) Date of Patent: Jul. 12, 2011

(54) METHOD FOR FABRICATING A TRANSISTOR WITH RELIABLE SOURCE DOPING

(75) Inventors: Martin Knaipp, Unterpremstätten (AT); Georg Röhrer, Graz (AT)

(73) Assignee: austriamicrosystems AG, Unterpremstätten (AT)

(*) Notice: Subject to any disclaimer, the term of this patent is extended or adjusted under 35 U.S.C. 154(b) by 230 days.

(21) Appl. No.: 12/083,169

(22) PCT Filed: Oct. 6, 2006

(86) PCT No.: PCT/EP2006/009685

§ 371 (c)(1),
(2), (4) Date: Jan. 12, 2009

(87) PCT Pub. No.: WO2007/039312

PCT Pub. Date: Apr. 12, 2007

(65) Prior Publication Data

US 2009/0215235 A1 Aug. 27, 2009

(30) Foreign Application Priority Data

Oct. 6, 2005 (DE) ........................ 10 2005 048 000

(51) Int. Cl.
*H01L 21/336* (2006.01)

(52) U.S. Cl. ........ 438/286; 438/232; 438/289; 257/335; 257/E21.435

(58) Field of Classification Search ........................ None
See application file for complete search history.

(56) References Cited

U.S. PATENT DOCUMENTS

| | | | | |
|---|---|---|---|---|
| 3,900,352 | A | 8/1975 | Potter | |
| 5,296,393 | A | 3/1994 | Smayling et al. | |
| 6,124,177 | A | 9/2000 | Lin et al. | |
| 6,635,925 | B1 * | 10/2003 | Taniguchi et al. | 257/335 |
| 6,784,059 | B1 | 8/2004 | Taniguchi et al. | |
| 6,930,005 | B2 * | 8/2005 | Efland et al. | 438/286 |
| 6,960,807 | B2 * | 11/2005 | Pendharkar | 257/336 |
| 7,498,652 | B2 * | 3/2009 | Pan et al. | 257/492 |
| 2002/0055233 | A1 | 5/2002 | Mitros | |
| 2005/0064670 | A1 * | 3/2005 | Pan et al. | 438/305 |

FOREIGN PATENT DOCUMENTS

| | | | |
|---|---|---|---|
| DE | 2450230 | A1 | 5/1975 |
| DE | 4341517 | C2 | 12/1995 |
| DE | 19928795 | A1 | 1/2001 |

OTHER PUBLICATIONS

Taur, Yuan et al., "Fundamentals of Modern VLSI Devices", Cambridge University Press, 1998 (248 pages).

* cited by examiner

*Primary Examiner* — Thanh V Pham
*Assistant Examiner* — Andres Muñoz
(74) *Attorney, Agent, or Firm* — Cohen Pontani Lieberman & Pavane LLP

(57) ABSTRACT

A transistor and a method for the fabrication of transistors with different gate oxide thicknesses is proposed, in which for the doping of the source, the typical LDD implantation, which is formed after the fabrication of the gate electrode, is replaced by a doping step, which is generated before applying the gate stack. In this way that is already a component of the remaining process sequence in the fabrication of the transistor doping can be used.

6 Claims, 4 Drawing Sheets

METHOD FOR FABRICATING A TRANSISTOR WITH RELIABLE SOURCE DOPING

RELATED APPLICATIONS

This is a U.S. national stage of application No. PCT/EP2006/009685, filed on 6 Oct. 2006.

This patent application claims the priority of German patent application no. 10 2005 048000 filed 6 Oct. 2005, the disclosure content of which is hereby incorporated by reference.

FIELD OF THE INVENTION

The present invention is directed to a method for fabricating a transistor with reliable source doping and, in particular, a high-voltage transistor.

BACKGROUND OF THE INVENTION

In the fabrication of low-voltage field-effect transistors, at least one body doping which corresponds to the doping of the channel zone is generated in the substrate. In a later step, the gate oxide is produced, typically through oxidation. In addition, the gate is produced, e.g., by means of applying and structuring a polysilicon layer, which is then structured, optionally together with the gate oxide.

Only subsequent to this structuring is the so-called LDD (=Lightly Doped Drain) implantation performed, with which a shallow doping is generated with a dopant of the second conductivity type in the source and drain region of low-voltage transistors and preferably also high-voltage transistors.

In a narrowed implantation region, the relatively high terminal doping of the second conductivity type then is produced for the source and drain connection, wherein the narrowed implantation region can be produced in a simple way by forming a spacer on the gate stack, which is formed from gate oxide and polysilicon gate.

For a semiconductor process with different gate oxide thicknesses, there is the problem that in the structuring of the gate stack, the gate oxide is not completely removed in the area of the LDD doping to be generated in case of a thicker gate oxide, in order not to generate undesired oxide ablation at other positions. In this way, LDD implantation can now be optimized for thin gate oxide thicknesses, as they are used for low-voltage transistors. For high-voltage transistors, which can have thicker gate-oxide thicknesses, however, the energy of LDD implantation is too small to penetrate through the thick gate oxide. This leads to a transistor with degraded electrical connection to the source, wherein the problem is aggravated with increasing thickness of the gate oxide.

SUMMARY OF THE INVENTION

One object of the present invention is to provide with a fabrication method for the source doping, that can be used independent of the gate oxide thickness and therefore for both low-voltage and also high-voltage transistors.

This and other objects are attained in accordance with one aspect of the present invention directed to a method for the fabrication of a high-voltage transistor, comprising the steps of forming, in a substrate, a first deep well of a first conductivity type and a second deep well of a second conductivity type; performing, by means of a mask, a first implantation of dopant for the second conductivity type, with which a doped region is formed on a top side of the substrate at a side of the second deep well; performing, by means of another mask, a second implantation of dopant; forming a channel zone of defined length and an LDD region adjacent to the channel zone on a side facing away from the second deep well by setting the conductivity type of the second implantation and also the areas of the first and second implantations defined by the respective masks; producing a gate oxide; producing a gate electrode arranged above the gate oxide in the area of the channel zone, and after the fabrication of the gate electrode: producing a doped region for a body contact by means of another implantation for the first conductivity type; and performing a terminal doping, which is provided for a source contact and which reinforces the LDD implant of the LDD region at a distance to the gate electrode, by means of another implantation for the second conductivity type.

It is proposed to eliminate the LDD implant for the doping of source and drain regions of a first transistor and to replace it with doping that is already used at another point in the processing sequence and which is formed before the production of gate stack and especially before the production of the gate oxide.

By suitable selection of the structure of the first transistor, especially the type, extent, and relative arrangement of the doped regions, a transistor can be obtained that allows a suitable connection to the source. In this way, a simplified fabrication method is also produced, which can eliminate the step of an additional LDD implantation for transistors with a thicker gate oxide.

For the transistor, there is also the advantage that the length of the transistor channel is now no longer dependent on the orientation of two different masks relative to each other or one mask relative to the gate, but is determined only by the structure of one mask. In this way, a transistor of constant, easily adjustable channel length is produced, which is now independent of a change in the other processing or structuring parameters. In this way, the parameters that are dependent on the channel length of the transistor are also realized with higher accuracy and less deviation from the desired values. With the proposed transistor, certain structural tolerances can be successfully eliminated in this way, and a narrower transistor design and thus a transistor of smaller surface area is possible.

A transistor that takes into account these viewpoints has:

a substrate, body doping of the first conductivity type, a source and a drain region, which each have high terminal doping of the second conductivity type, a gate oxide, a gate electrode arranged above the gate oxide and in the area of a channel zone, wherein, in the source region, another shallow doping of the second conductivity type is generated, which is inserted in the transistor in at least one other position for generating a functional doping and which is generated before the application of the gate oxide and thus independently of the position of the gate oxide. This other shallow doping can also be formed in parallel in the drain region of the transistor. Here, the transistor can be of the high-voltage type. It is advantageous that this doping is also suitable for low-voltage transistors and therefore different transistor types can be produced in parallel with the same doping in the source and drain region, in the same doping step.

It is possible, for example, for generating the other shallow doping of the second conductivity type to use the same doping and the same doping step as used also for the body doping of the complementary transistor, wherein the two equal dopings can be generated in parallel in the same step.

In principle, the first transistor can be of the p-channel type or of the n-channel type and can represent, accordingly, a PMOS or NMOS transistor. In the following, suitable structures for a PMOS transistor are specified as a first transistor, which, however, can also be adapted easily for an NMOS transistor.

For example, in a PMOS transistor for further shallow doping in the source region, doping can be used that corresponds to the body doping of the second NMOS transistor complementary to the first transistor and which is constructed, for example, as a shallow p-type well. For this purpose, the implantation mask for the shallow p-type well is provided with an additional opening for the desired p-doping in the source and/or drain region.

Another possibility consists in masking the body doping of the first transistor in the area of the source region. Then, for generating the other shallow doping a low implantation dose is sufficient. This shallow doping can be implemented with a doping of the second conductivity type, which is used in at least one other position of the transistor for another structure or another purpose. Such shallow doping is used, for example, to set the threshold voltage of the transistor. This so-called VT Implant (Threshold Implant) involves a relatively shallow doping of, e.g., only 0.2 μm depth, which can generate in the present embodiment the desired counter doping (relative to the substrate or body doping) in the source region.

In another construction, the first transistor has body doping that is limited in terms of surface area to the region of the channel zone. Accordingly, in this case, the area of the source region is also masked from the body doping, so that the other shallow doping of the second conductivity type can be constructed with the above-mentioned shallow doping, for example, the above-mentioned doping for setting the threshold voltage. Here, it can be advantageous to mask the VT implant in the channel zone, in order to obtain a suitable threshold voltage.

In an NMOS transistor, the body doping can be realized as a shallow p-type well, which is arranged in a deep p-type well and boosts its n-doping. This shallow p-type well can then be masked in the area of the source region and optionally also in the area of the channel zone. In this case, a body and thus also a channel zone that are each doped only weakly are obtained.

BRIEF DESCRIPTION OF THE DRAWINGS

The figures are purely schematic and not true to scale, so that neither absolute nor relative dimensional information can be inferred from the figures.

DETAILED DESCRIPTION OF THE DRAWINGS

Figure 1A:
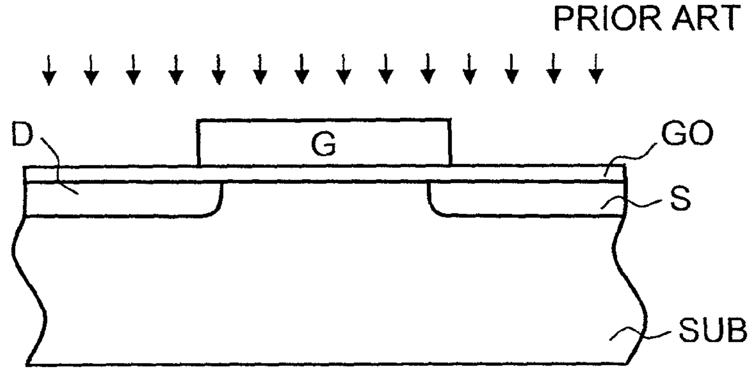
FIG. 1A shows a known low-voltage transistor in schematic cross section during the LDD implantation.

FIG. 1A shows a known low-voltage transistor in schematic representation during and after the LDD implantation indicated in the figure by arrows, for producing the source S and drain D, respectively. The implantation takes place through the gate oxide GO after structuring the gate G. The gate oxide GO is thin enough to guarantee penetration of the implanted dopants of the second conductivity type. For the sake of simplicity, the doped regions of the LDD implant are shown already in their final extent.

Figure 1B:
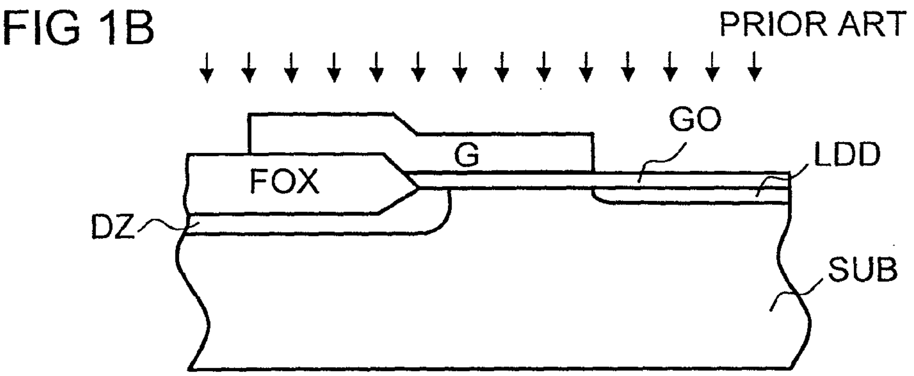
FIG. 1B shows the source side of a known high-voltage transistor during the LDD implantation.

FIG. 1B shows the situation during the same LDD implant for a high-voltage transistor. The source side of the transistor (i.e. on the right side of FIG. 1B), on which the gate G and substrate SUB are separated only by the gate oxide GO, is shown. Under a field-oxide region FOX, a drift zone DZ of the second conductivity type is arranged.

The LDD implantation, shown in the figure by arrows, is masked by the gate oxide GO, which is significantly thicker in comparison with the low-voltage transistor, remains bonded at least partially in this region and does not lead to a sufficient doping LDD of the source region, shown very shallow in the figure, and thus leads to an insufficient channel connection. To solve this problem, it would be possible to increase the implantation energy for the LDD implant, but for this purpose a separate mask and an additional implantation step would be required. Another possibility consists of thinning the gate oxide before the LDD implant in the source region, but for this a separate mask and an additional processing step would also be required.

Figure 2A:
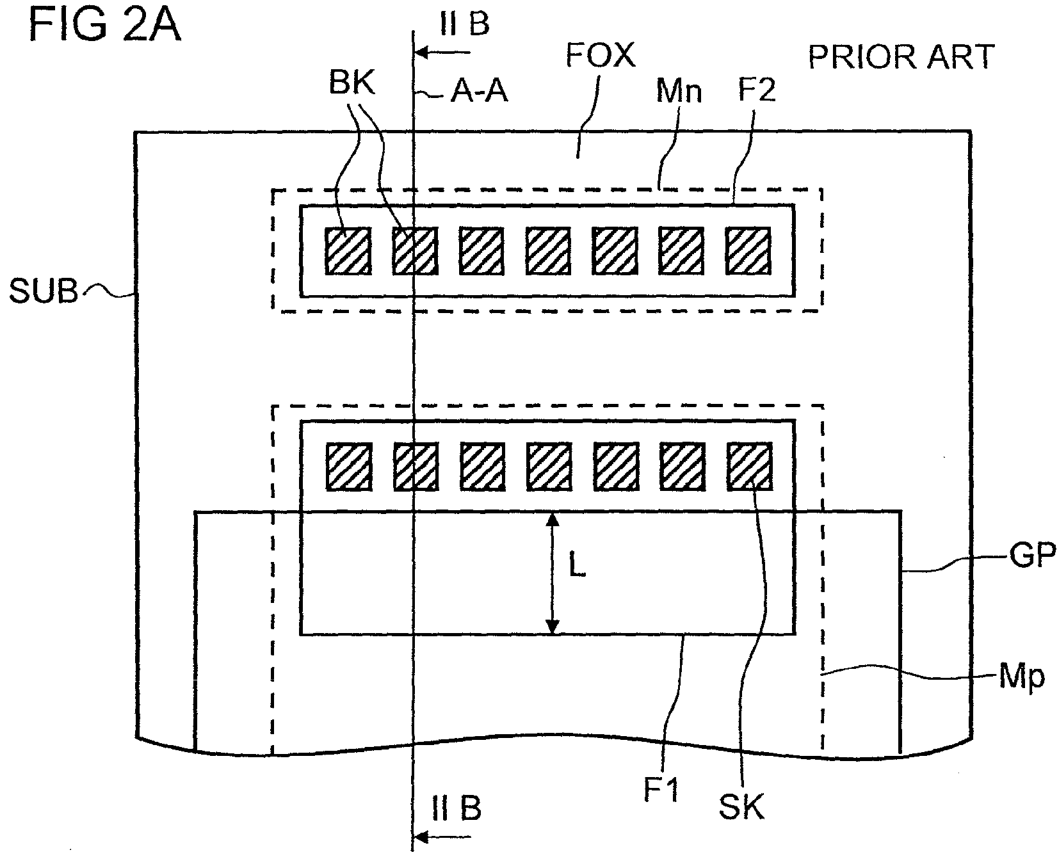
FIG. 2A shows the mask arrangement for different implantation steps on the source side of a known transistor.

FIG. 2A shows schematically the two-dimensional arrangement of mask openings, structural regions, and doping zones in a known p-channel high-voltage transistor with the assumption that the LDD implantation was successful. The source side of the transistor, which is essentially covered by a field oxide FOX is shown. From the field oxide, two windows F1 and F2 are masked, wherein the first window F1 corresponds to the source and channel region of the transistor. The gate partially overlaps the active surface area of the transistor and is shown in the figure by the gate polysilicon GP, which forms the gate electrode. In the area of the first window F1 not covered by the gate polysilicon, the source contacts SK are arranged, via which the source region is contacted electrically to the outside. Mp designates the mask used for the $p^+$-doping of the source connection.

The substrate or body contact BK is arranged in the second window F2. Underneath the second window F2, an $n^+$-doping is formed, for example, by the mask window Mn indicated here.

Figure 2B:
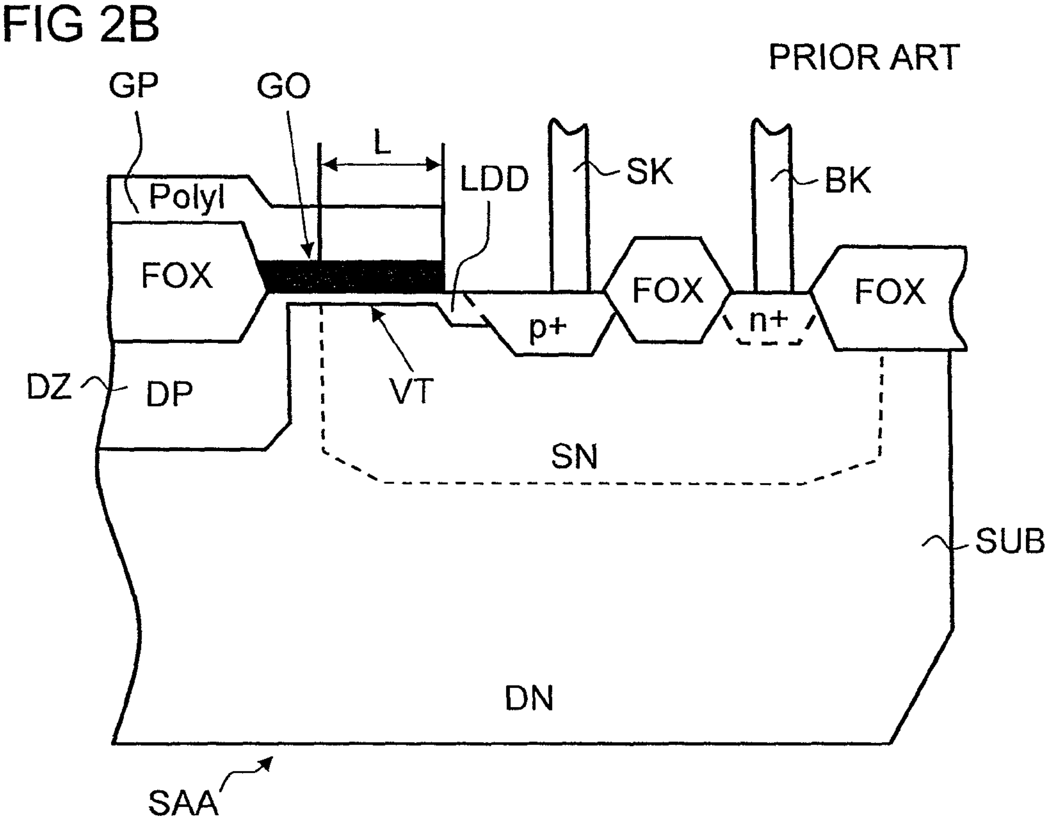
FIG. 2B shows the known transistor of FIG. 2A after completion in schematic cross section.

FIG. 2B shows the known above-explained transistor in schematic cross section SAA along the section line A-A of FIG. 2A. Again, the source side, on which the gate electrode GP is laid on the substrate SUB separated by the gate oxide GO, is shown. The entire transistor region is arranged in a deep n-type well DN. On the drain side, there is an embedded deep p-type well DP, which extends up to the source-side end of the field oxide FOX. A shallow n-type well SN, which adjoins the deep p-type well DP with a small separation, and there boosts the n-doping of the deep n-type well DN, forms the body of the transistor.

The body contact BK, under which an $n^+$-doping is provided, is also arranged within the shallow n-type well SN. Underneath the source contact SK there is $p^+$-doping as terminal doping, which boosts the LDD implant LDD at a distance to the gate electrode GP. Underneath the gate oxide GO, a shallow p-doping VT is formed, which is used for setting the transistor threshold voltage (Threshold Implant) and is generated before the application of the gate oxide GO. The channel length L is measured from the left end of the shallow n-type well SN in the figure up to the right end of the gate electrode GP, wherein the channel length L is defined by the arrangement of the shallow n-region SN relative to the gate electrode GP. The shallow p-doping VT is not occupied with holes at 0 V gate voltage for a gate electrode doped with donors. For this reason, the transistor is then switched off.

Figure 3:
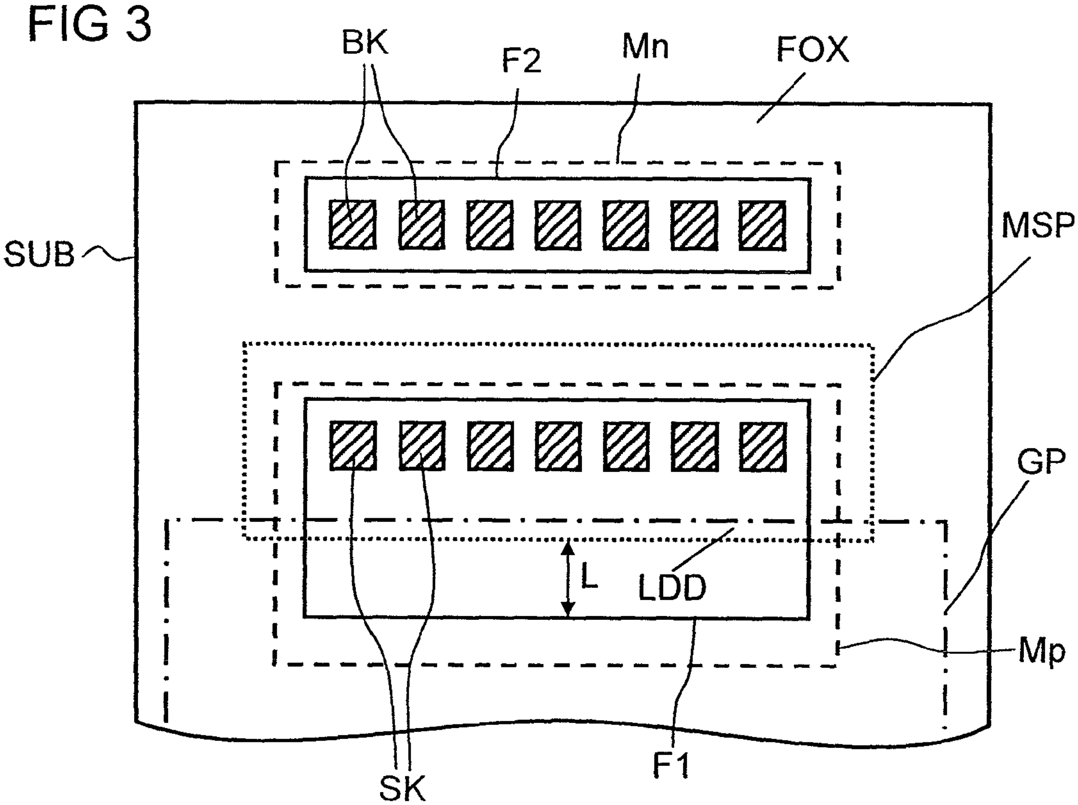
FIG. 3 shows the positioning of the masks for a first embodiment.

FIG. 3 shows a first embodiment of a transistor, in which the generation of the other shallow doping in the source and drain region takes place before the generation of the gate oxide and the gate electrode above. For generating this region, a shallow p-type well is defined and formed with the help of a mask MSP, whose boundary is drawn in FIG. 3. In the same step, the fabrication of the shallow p-type well is used for fabricating the body doping of the complementary NMOS transistor at another position. In an existing CMOS process, only the mask for the shallow p-type well is changed or adapted, in order to replace the LDD implant in the area of the source. This doping is formed after the generation of the field-oxide regions, wherein openings in the field oxide represent, in turn, first and second windows F1, F2 in FIG. 3. Unchanged relative to FIG. 2A, the body contact BK together with the $n^+$-doping Mn underneath is arranged in the second window F2. The active surface area, which is partially overlapped by the gate electrode GP, lies in the first window F1. The source contacts SK are in the non-overlapped region and are thus accessible from above. Mp specifies a mask opening for the $p^+$-doping, with which the source terminal doping and optionally other $p^+$-dopings are generated. This mask Mp also extends over the drain region, in order to generate the terminal doping for the drain contact there (not shown in the figure).

It is clearly visible from the figure that the length L of the channel zone in this embodiment is no longer dependent on the relative arrangement of the gate electrode GP and the doped regions underneath. Instead, the length L of the channel zone is determined by the distance of the shallow p-type well generated with the mask MSP and the adjacent edge of the window opening F1 at the bottom in FIG. 3. That is the region in which the gate electrode GP overlaps an area of the substrate having only the body doping, that is, that area within the window F1 in which there is only the body doping and not the additional doping of the shallow p-type well that is implanted by means of the mask MSP.

In addition, this transistor and the method used for its fabrication have the advantage that the other shallow doping in the source region can be generated independently of the thickness of the gate oxide, so that this step can be used for the parallel production of these regions for different transistors with gate oxides of different thicknesses and especially on the same wafer.

Figure 4A:
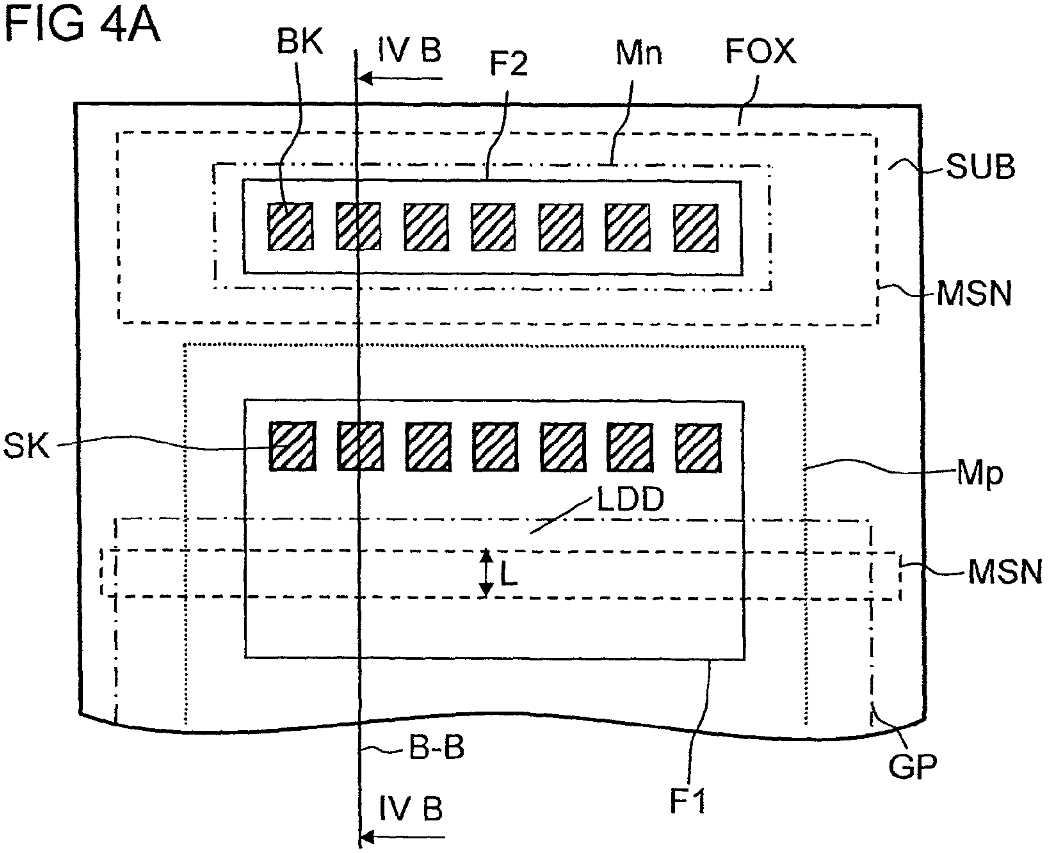
FIG. 4A shows the positioning of the masks for a second embodiment.
Figure 4B:
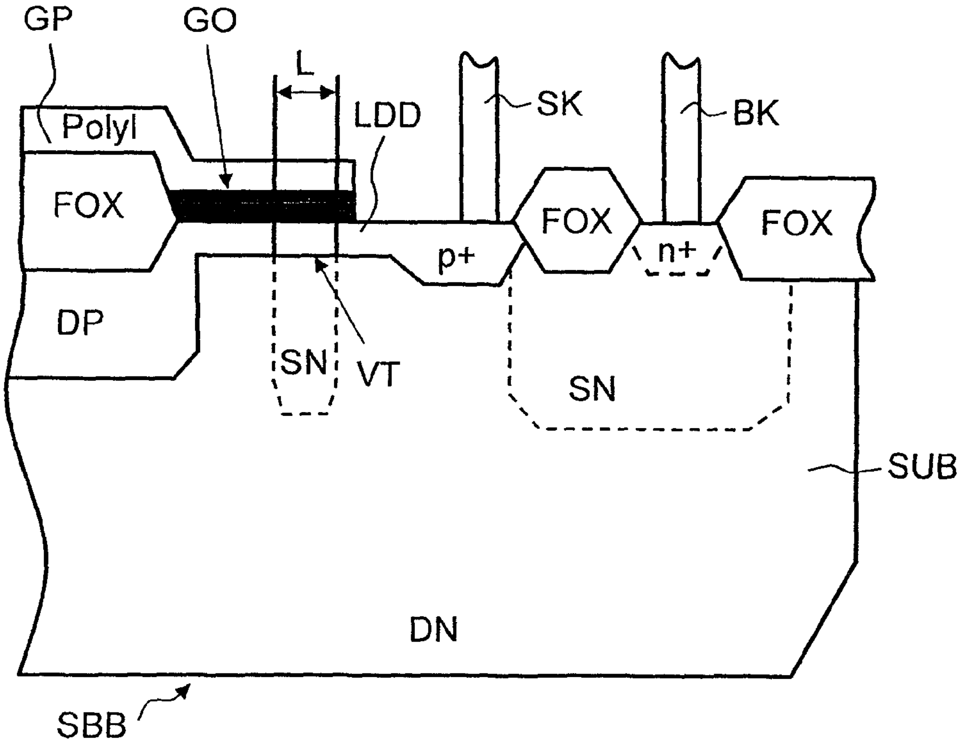
FIG. 4B shows the transistor according to the second embodiment in schematic cross section.

FIG. 4 shows FIGS. 4A and 4B show another embodiment, with which the doping of the source region of a transistor (here: PMOS) can be performed independently of the thickness of the gate oxide and which also has the advantage that the channel length L can be set independently of the relative orientation to the gate electrode. In this embodiment, the doping of the substrate/body is masked at least in the area of the source. For this purpose, the mask MSN for the fabrication of the shallow n-type well within which the source region and the channel zone are arranged is structured in such a way that the shallow n-type well is interrupted underneath the source. FIG. 4A shows the mask MSN for the shallow n-type well, which has an opening F2 in the area of the substrate or body contact BK and in the area of the channel zone. Therefore, underneath the source doping, only the doping of the deep n-type well DN is active, but not the higher doping from the combination of the deep n-type well DN and shallow n-type well SN (see FIG. 4B).

FIG. 4A shows the position of the mask MSN for the shallow n-type well. The other wells remain unchanged in comparison to the known transistor according to FIG. 2. Compared to the first embodiment according to FIG. 3, the mask opening MSP in the area of the source contact is missing. The opening in mask MSN shown in FIG. 4A is arranged in the area of the first window F1 in such a way that it is completely overlapped by the gate electrode GP. It is shown in connection with FIG. 4B that the length L of the channel zone is now determined just by the width of the shallow n-type well underneath the gate. In the area of the source contact, due to the low body doping only by the deep n-type well DN, the shallow p-doping VT is sufficient for setting the threshold value of the transistor, to replace the LDD implant necessary underneath the source in known transistors.

FIG. 4B shows the extent of this region generated by the so-called VT implant with reference to a schematic section SBB along the section lines B-B of FIG. 4A. The source terminal doping of $p^+$-type is generated directly in the area of the source contact SK at a small distance from the edge of the gate electrode GP.

Therefore, it is also possible with this second embodiment to eliminate the LDD implant especially for the source of the transistor. Reliable setting of the channel length L is simultaneously enabled, which now is dependent only on the width of the shallow n-type well region SN generated with the mask MSN. This structure can also be generated completely independently of the thickness of the gate oxide, because it is formed, with the exception of the source terminal dopings $p^+$, completely before the application of the gate oxide and the gate electrode.

Figure 5A:
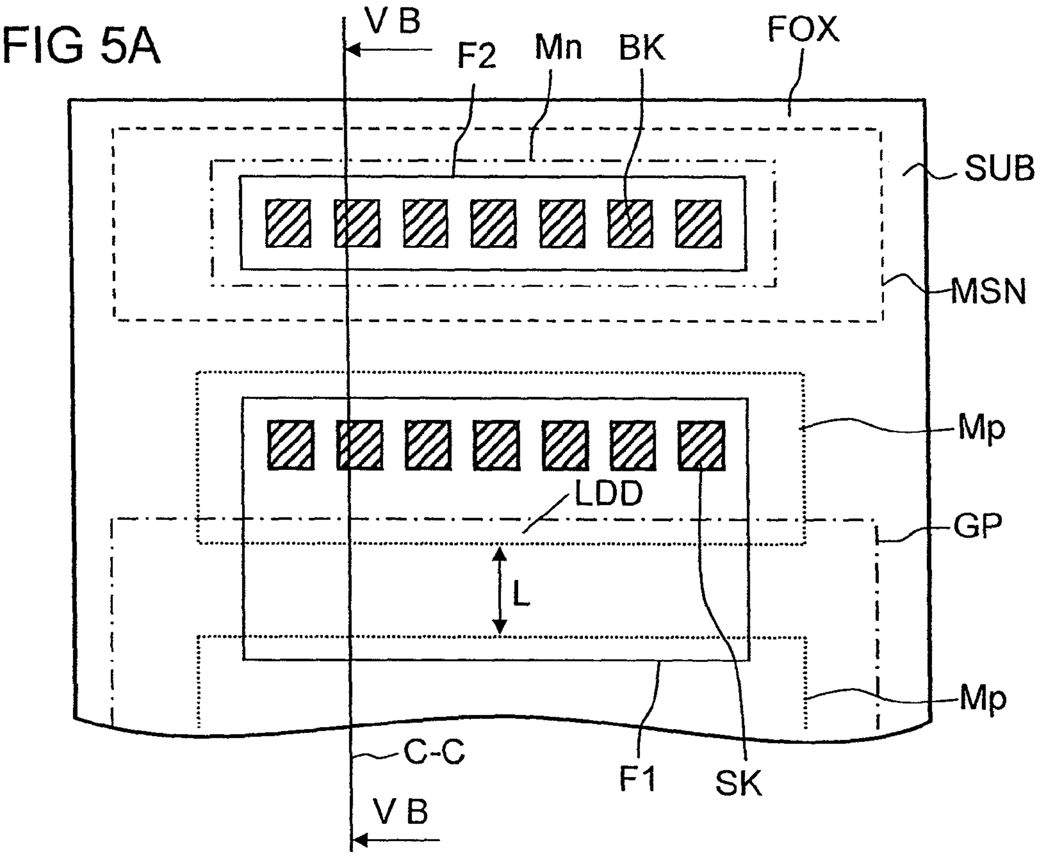
FIG. 5A shows the positioning of the masks for a third embodiment.
Figure 5B:
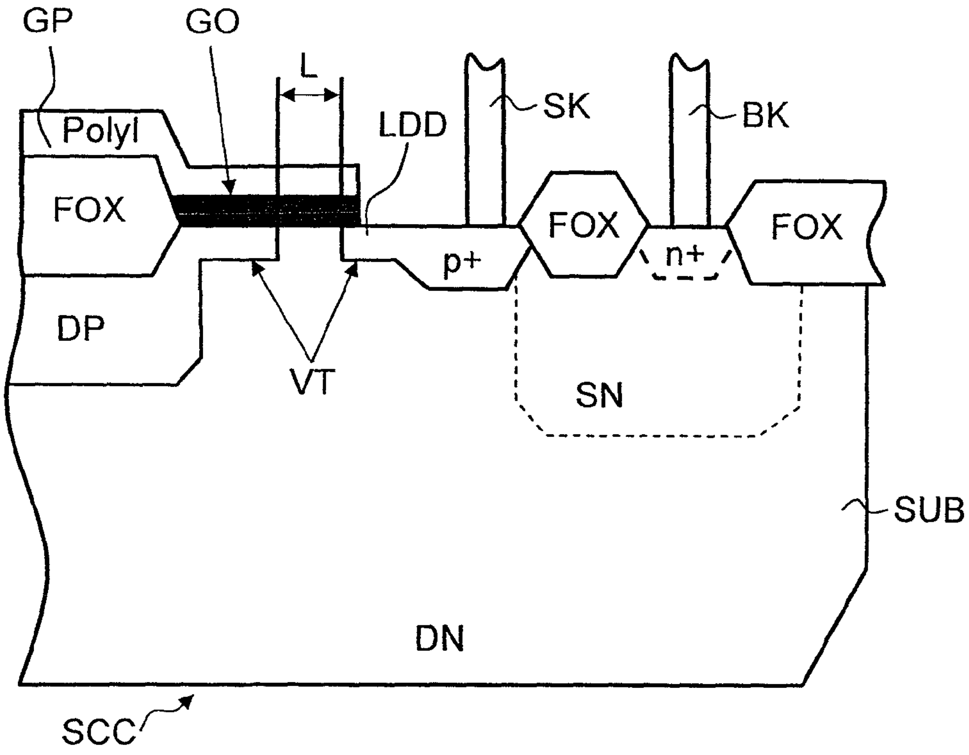
FIG. 5B shows the transistor according to the third embodiment in schematic cross section.

FIGS. 5A and 5B show another embodiment with reference to the mask arrangement according to FIG. 5A and the cross section SCC along the section line C-C shown in FIG. 5A. In this embodiment, in contrast with the second embodiment according to FIGS. 4A and 4B, the shallow n-type well SN underneath the channel zone is also eliminated (see FIG. 5B). The shallow n-type well therefore extends only in one region outside of the source region and is used only for the purpose of producing the body contact BK. To define the channel zone, however, the mask MP which is used both for forming the VT implant VT and also for forming the source terminal doping of the $p^+$-type is modified (see FIG. 5A). This mask has two openings, which are separated by a mask strip that defines the channel length L. Thus, the channel zone is the region underneath the gate electrode GP, in which no VT implant VT is formed due to the lack of the mask opening. Thus, in the channel region, only the shallow n-doping of the deep n-type well DN is active. In the second embodiment according to FIGS. 4A and 4B, the VT implant is also constructed in the channel region, which is overcompensated in this region, however, by the dopings of the deep n-type well DN and the shallow n-type well SN. In the second embodiment, the channel length is also defined by a single mask, namely by the mask for fabricating the VT implant. Possibly imprecise orientations of different masks relative to each other therefore no longer have an effect on the channel length and therefore no effect on the essential transistor characteristics defined by the channel length either.

As another effect of the third embodiment shown in FIGS. 5A and 5B, the doping of the channel zone is reduced, because no extra body doping—that is, no shallow n-type well—is generated there. In this way, the threshold voltage is reduced by a certain amount, in one embodiment of a high-voltage PMOS transistor from −0.8 V to −1.7 V. This is advantageous for the transistor, because leakage currents occurring at high temperatures are suppressed. The threshold voltage of the second embodiment (FIG. 4) lies at a low value due to the unchanged body doping and equals ca. −0.8 V in the selected embodiment.

With the invention it is possible, for the fabrication of source and drain dopings, to form a process sequence that can be used both for low-voltage and for high-voltage transistors. The process sequence is designed in such a way that source and drain dopings of both low-voltage transistors and high-voltage transistors of one type can be generated in parallel in the same processing step. This simplifies the processing sequence in all cases in which high-voltage and low-voltage transistors are realized one next to the other on one component. The transistors produced are also distinguished by an easily adjustable channel length L, which is significantly less sensitive to processing deviations and therefore leads to transistors with easily reproducible characteristics. The invention is especially suitable for the fabrication of source regions of high-voltage transistors of the PMOS type and can be used in corresponding modifications and for inversion of the conductivity types of various wells and doped regions for NMOS transistors as well.

The application was explained only with reference to a few concrete embodiments, but is not limited to these. Within the scope of the invention, it is possible to deviate from the actual transistor structures shown in the figures and described in the text and to use and implement correspondingly adapted and varying mask regions. However, it is advantageous that, in addition to the high source terminal doping created after the production of the gate stack, another shallow doping, which is formed before the production of the gate stack with a surface area larger relative to the source terminal doping, is used for the production of the source region. For these other shallow dopings, other dopings of the desired conductivity type in the process flow can also be used. These dopings can be a component of structures that are the opposite of the complementary transistor. It is especially advantageous, however, as described in FIGS. 4A, 4B, 5A and 5B with reference to the second and third embodiment, to use the shallow VT doping for setting the threshold voltage for the shallow doping in the source region as well. In all of the cases, suitable source terminals are obtained, which are distinguished by doping increasing up to the source contact SK. This is achieved by the overlapping of two doped regions, namely the above-mentioned source terminal doping and the other shallow doping.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A method for fabricating a high-voltage transistor, comprising the steps of:

forming, in a substrate, a first deep well having a first conductivity type and a second deep well having a second conductivity type;

performing, via a mask, a first implantation of dopant for the second conductivity type, with which a doped region is formed on a top side of the substrate lateral to the second deep well;

performing, via another mask, a second implantation of dopant for the second conductivity type at a distance from the second deep well, the first and second implantations forming a channel zone adjacent to the second deep well and a lightly doped drain (LDD) region adjacent to the channel zone on a side facing away from the second deep well;

producing a gate oxide;

producing a gate electrode arranged above the gate oxide in an area of the channel zone; and after fabrication of the gate electrode, producing a doped region for a body contact via an implantation of dopant for the first conductivity type and a doped region for a source contact via the implantation of the dopant for the second conductivity type.

2. The method according to claim 1, wherein the gate electrode is arranged to partially overlap an area of the second implantation of the dopant for the second conductivity type.

3. The method of claim 2, wherein the first conductivity type is n-conductive and the second conductivity type is p-conductive.

4. The method of claim 2, wherein a threshold voltage of the transistor is set via the first implantation of the dopant for the second conductivity type forming the doped region on the top side of the substrate lateral to the second deep well.

5. The method of claim 1, wherein the first conductivity type is n-conductive and the second conductivity type is p-conductive.

6. The method of claim 1, wherein a threshold voltage of the transistor is set via the first implantation of the dopant for the second conductivity type forming the doped region on the top side of the substrate lateral to the second deep well.

* * * * *